United States Patent
Maangat et al.

(10) Patent No.: US 7,154,324 B1
(45) Date of Patent: Dec. 26, 2006

(54) INTEGRATED CIRCUIT DELAY CHAINS

(75) Inventors: Simardeep Maangat, Sunnyvale, CA (US); Sergey Y. Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 98 days.

(21) Appl. No.: 10/935,867

(22) Filed: Sep. 7, 2004

(51) Int. Cl.
    *H03H 3/26* (2006.01)

(52) U.S. Cl. .............. 327/288; 327/513; 327/290; 327/284

(58) Field of Classification Search ........ 327/276–278, 327/512–513, 284, 288, 290
    See application file for complete search history.

(56) References Cited

U.S. PATENT DOCUMENTS

| | | | |
|---|---|---|---|
| 5,180,995 A * | 1/1993 | Hayashi et al. ............... | 331/57 |
| 5,899,724 A * | 5/1999 | Dobuzinsky et al. ........ | 438/384 |
| 5,907,255 A * | 5/1999 | Churchill .................... | 327/262 |
| 6,229,364 B1 * | 5/2001 | Dortu et al. ................ | 327/158 |
| 6,390,579 B1 | 5/2002 | Roylance et al. ............ | 347/9 |
| 6,544,807 B1 | 4/2003 | Bach .......................... | 438/18 |
| 6,665,230 B1 | 12/2003 | Shrader et al. ............. | 327/166 |
| 6,707,331 B1 | 3/2004 | Nguyen ...................... | 365/233 |
| 6,822,504 B1 * | 11/2004 | Morikawa ................... | 327/513 |
| 6,901,022 B1 * | 5/2005 | Fiscus ........................ | 365/222 |
| 2002/0027227 A1 * | 3/2002 | Kang .......................... | 257/66 |

* cited by examiner

*Primary Examiner*—Quan Tra
(74) *Attorney, Agent, or Firm*—G. Victor Treyz

(57) ABSTRACT

Delay chain circuitry is provided. The delay chain circuitry has a number of delay chain inverters. Each delay chain inverter is connected in series with a load resistor and has an associated capacitor between its input and ground. The electrodes of each capacitor may be formed from metal separated by non-gate-oxide dielectric to maintain accurate capacitor tolerances. A stable current source such as a bandgap reference current source may apply a current to a sensing resistor. The resulting bias voltage is indicative of changes in resistance due to changes in operating temperature. A temperature compensation circuit may use the bias voltage to produce temperature-compensation control signals. The temperature-compensation control signals are applied to the delay chain inverters to adjust their resistances and compensate for temperature-induced changes in the resistances of the load resistors. This ensures that the delay of the delay chain is independent of operating temperature.

13 Claims, 11 Drawing Sheets

INTEGRATED CIRCUIT DELAY CHAINS

BACKGROUND OF THE INVENTION

This invention relates to integrated circuits such as programmable logic device integrated circuits, and more particularly, to accurate delay chain circuitry for integrated circuits.

Integrated circuits such as programmable logic devices often contain delay chain circuits for use in phase-locked loops, delay-locked loops, programmable delay circuits, input and output circuits, and other circuitry. A typical delay chain has a number of series-connected inverters. When a signal is applied to the input of the chain, it propagates though the inverters. Each inverter contributes a delay. The total delay of the chain is equal to the sum of the delays contributed by each inverter in the chain.

The accuracy of delay chain circuits is often critical for satisfactory device performance. If a delay chain is too fast or too slow, signals passing through the chain will not be delayed by the desired amount and the integrated circuit may not function properly.

Conventional programmable logic device delay chain circuits are susceptible to changes induced by temperature fluctuations and process variations. These sources of error reduce accuracy and make it difficult or impossible to use delay chain circuits effectively in many applications.

It would be desirable to be able to provide ways in which to increase delay chain circuit accuracy on integrated circuits such as programmable logic devices.

SUMMARY OF THE INVENTION

In accordance with the present invention, delay chain circuitry is provided for integrated circuits. The delay chain circuitry may be used in input-output circuits, phase-locked loops and delay-locked loops, etc. The delay chain circuitry may be used to form a programmable delay chain circuit on a programmable logic device.

The delay chain circuitry has a number of delay chain stages. Each delay chain stage has a delay chain buffer such as a delay chain inverter and has an associated series-connected load resistance. A capacitor such as a non-gate-oxide capacitor is connected between ground and the input of each delay chain buffer.

The load resistors have associated load resistances. Load resistors may be formed using any suitable integrated circuit resistor structure. For example, the load resistors may be formed using polysilicon resistors or diffused resistors. To compensate for temperature-induced resistance changes in the load resistors, which would otherwise affect the RC delays of the delay chain stages and the overall delay of the delay chain, a temperature-compensation circuit is used to adjust the resistance of each delay chain inverter. This resistance adjustment compensates for the changes in resistance of the load resistors.

With one suitable arrangement, the temperature-compensation circuit has a sensing resistor fabricated using the same type of structure as the load resistors. The sensing resistor has a resistance that varies with operating temperature in the same way that the resistance of the load resistors changes with operating temperature. By monitoring changes in the sensing resistor, the temperature-compensation circuit can adjust the internal resistances of the delay chain inverters so that the total resistance of each delay chain stage remains constant, even as the operating temperature varies.

Further features of the invention, its nature and various advantages will be more apparent from the accompanying drawings and the following detailed description of the preferred embodiments.

21 vary as a function of the control signal VBIAS in accordance with the present invention.

Figure 23:
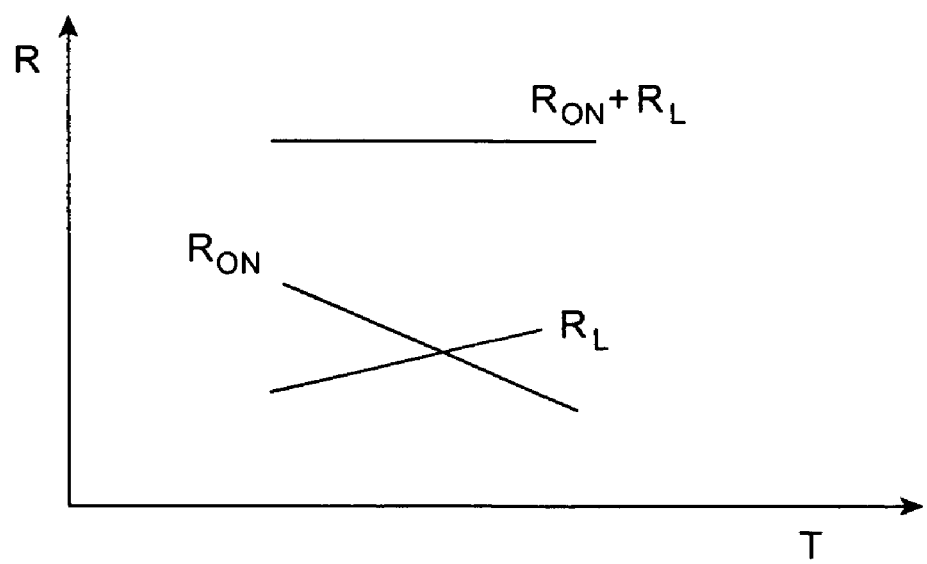

FIG. 23 is a graph showing how the temperature-dependent internal resistance of a delay chain stage balances the temperature-dependence of its associated delay chain load resistance to help stabilize the delay chain against temperature-induced performance variations in accordance with the present invention.

Figure 24:
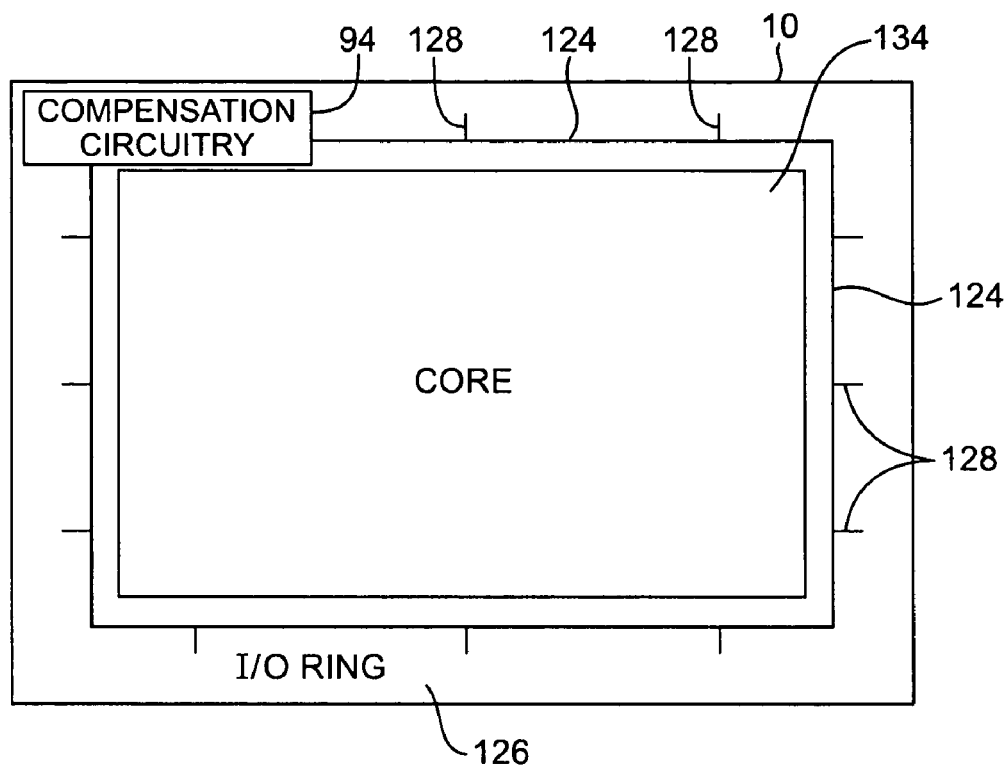

FIG. 24 is a top view of an illustrative integrated circuit in which delay chain compensation control signals are distributed about the periphery of the integrated circuit on I/O ring bus conductors in accordance with the present invention.

Figure 25:
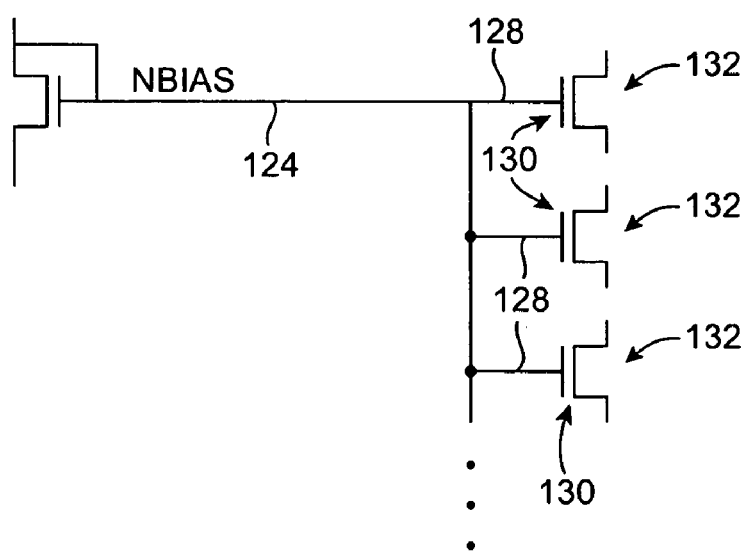

FIG. 25 is a circuit diagram showing how the NBIAS delay chain compensation control signal may be distributed on an integrated circuit in accordance with the present invention.

DETAILED DESCRIPTION OF THE PREFERRED EMBODIMENTS

The present invention relates to arrangements that may be used to improve the accuracy of delay chain circuitry on integrated circuits. The invention applies to any suitable integrated circuits such as digital signal processors, microprocessors, application-specific integrated circuits, etc. For clarity, the present invention will sometimes be described in the context of digital integrated circuits such as programmable logic device integrated circuits. This is, however, merely illustrative.

Figure 1:
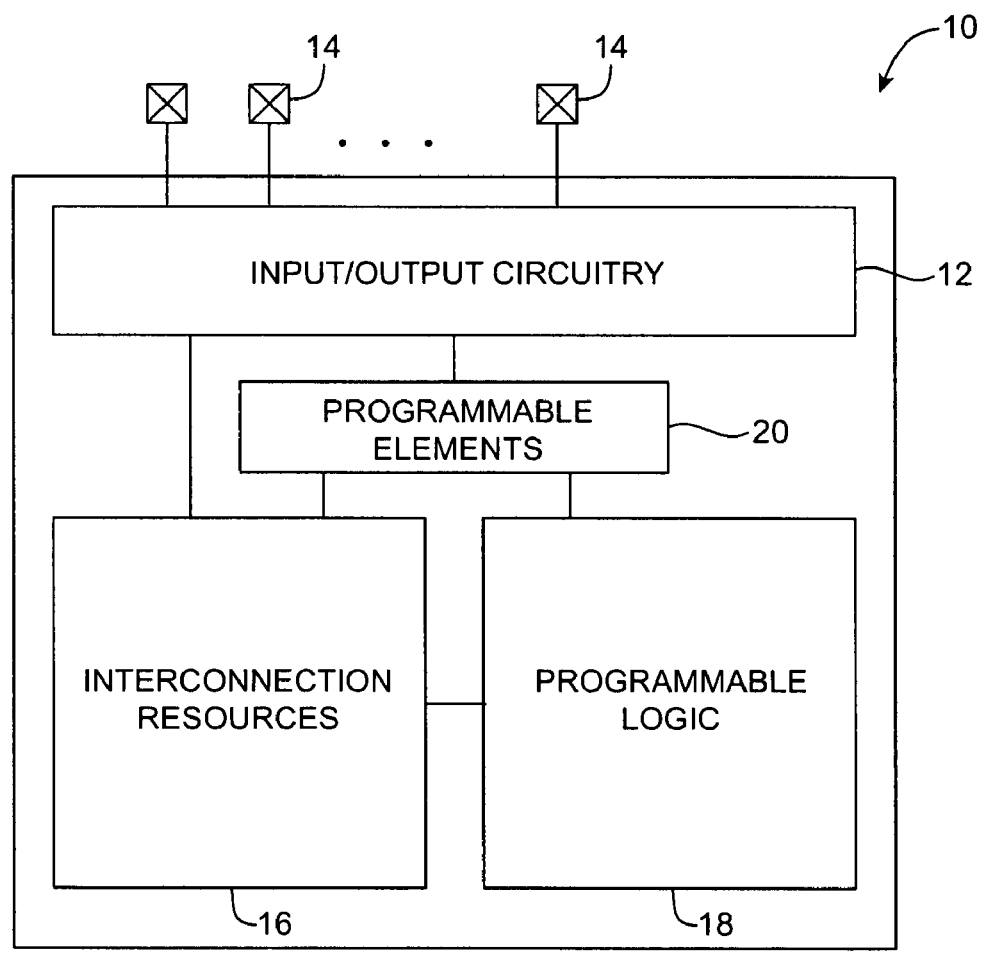
FIG. 1 is a schematic diagram of an illustrative programmable logic device integrated circuit in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as vertical and horizontal conductive lines may be used to route signals on device 10. Programmable logic 18 may include combinational and sequential logic circuitry. The programmable logic 18 may be configured to perform a custom logic function.

Programmable logic device 10 may be based on any suitable programmable technology. With one suitable approach, configuration data (also called programming data) may be loaded into programmable elements 20 using pins 14 and input/output circuitry 12. The programmable elements (also sometimes called configuration bits or programmable function control elements) may each provide a static control output signal that controls the state of an associated logic component in programmable logic 18.

As an example, the programmable elements 20 may be random-access memory (RAM) cells that are loaded from an external erasable-programmable read-only memory chip via pins 14 and input/output circuitry 12. The loaded RAM cells 20 provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses, programmable logic devices in which elements 20 are formed from electrically-programmable read-only-memory (EPROM) or erasable-electrically-programmable read-only-memory (EEPROM) technology, programmable logic devices with programmable elements made from magnetic storage elements, mask-programmed programmable elements, etc.

Regardless of the particular type of programmable element arrangement that is used for device 10, programmable elements are preferably provided with configuration data by a user (e.g., a logic designer). Once provided with configuration data, the programmable elements 20 selectively control (e.g., turn on and off) portions of the circuitry in the programmable logic 18 and thereby customize its functions so that it will operate as desired.

The circuitry on device 10 may be controlled using signals from external sources (e.g., control signals received from other integrated circuits via input/output circuitry 12) or signals from internal circuitry such as programmable elements 20 and programmable logic 18. The signals from programmable elements 20 generally do not change once device 10 has been programmed, so these signals may be referred to as static signals. The signals from programmable logic 18 generally change in real time during the operation of programmable logic device 10, so these signals may be referred to as dynamic signals.

The circuitry of device 10 may be organized using any suitable architecture. As an example, the logic of programmable logic device 10 may be organized in a series of rows and columns of one or more larger programmable logic regions or areas (sometimes referred to as logic array blocks or LABs) each of which contains multiple smaller logic regions or areas (sometimes referred to as logic elements or LEs). These logic resources may be interconnected by interconnection resources 16 such as associated vertical and horizontal conductors. The interconnection conductors 16 may include global conductive lines that span substantially all of device 10, fractional lines such as half-lines or quarter lines that span a substantial part of device 10, staggered lines of a particular length (e.g., sufficient to interconnect several logic areas), smaller local lines that interconnect certain logic regions with other logic regions in a given area, or any other suitable interconnection resource arrangement. Multiplexers and other suitable circuits may be used to interconnect vertical and horizontal conductors to form various user-selected signal paths throughout device 10. If desired, the logic of device 10 may be arranged in more levels or layers in which multiple large areas are interconnected to form still larger portions of logic. Still other device arrangements may use logic that is not arranged in rows and columns.

The programmable logic 18 may be based on look-up tables (LUTs) or any other suitable configurable logic circuits. Logic elements (LEs) and other circuits on device 10 may contain register logic for selectively registering data signals.

If desired, dedicated circuits such as digital signal processing circuits and memory circuits may be provided on circuit 10. Dedicated circuits (sometimes called hardwired circuits even though they may have modest capabilities for being programmed or reconfigured by a user) are more efficient than general-purpose programmable logic resources such as the programmable look-up tables and registers of logic elements for performing certain tasks.

One or more delay chain circuits may be used on integrated circuits such as integrated circuit 10. Delay chains use buffer stages (inverters) to provide a certain amount of time delay. The input signal to a delay chain is inverted as it passes through each inverter stage in the chain. Each stage contributes delay, so the overall delay of the chain can be adjusted by controlling the number of stages in the chain. Both hardwired and programmable delay chains may be used on circuit 10.

Figure 2:
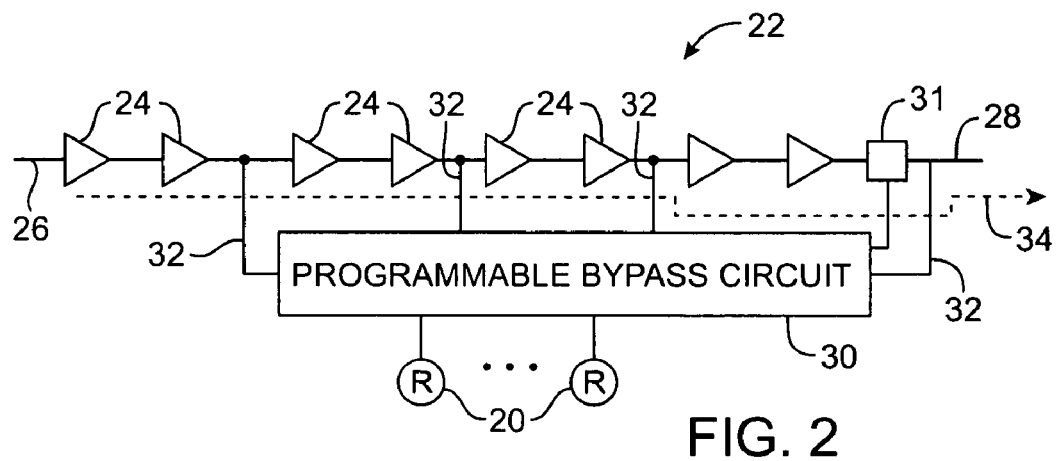
FIG. 2 is a circuit diagram of an illustrative programmable delay chain in accordance with the present invention.

A programmable delay chain 22 is shown in FIG. 2. The delay chain 22 has a number of stages based on delay chain buffers 24. Buffers 24 are typically inverters and are described herein as inverters for clarity.

An input signal (e.g., a digital high or low signal) that is applied to input 26 is inverted repeatedly by each of the inverters 24 in circuitry 22. Each inverter contributes delay to the signal. The output signal at output 28 is delayed relative to the input signal that was applied to input 26 by a delay that is equal to the sum of the delays provided by each of the inverter stages in the delay chain.

Programmable bypass circuit 30 may be used to change the amount of delay provided by delay chain circuit 22. The states of programmable elements 20 can be adjusted to control programmable bypass circuit 30. The control signals applied to programmable bypass circuit 30 by programmable elements 20 control which of the bypass paths 32 are active. If no paths 32 are active, the input signal at input 26 passes to output 28 with the maximum amount of delay possible. In the example of FIG. 2, delay chain circuit has eight stages, so the maximum amount of delay is equivalent to eight stages of delay. (In general, the delay circuits can have any suitable number of stages).

If less than eight stages of delay is desired, the static control signals provided by elements 20 (or suitable dynamic control signals) may be adjusted to direct programmable bypass circuit 30 to activate appropriate bypass paths 32 and to open switch 31. If, for example, six stages of delay are desired, two of the stages in delay chain 22 may be bypassed, as shown by dotted line 34. If four stages of delay are desired, four stages may be bypassed. If two stages of delay are desired, six stages may be bypassed. The arrangement of FIG. 2 is merely illustrative. Any suitable arrangement may be used to provide a delay chain with a programmable number of delay chain stages and an associated programmable delay time if desired.

Figure 3:
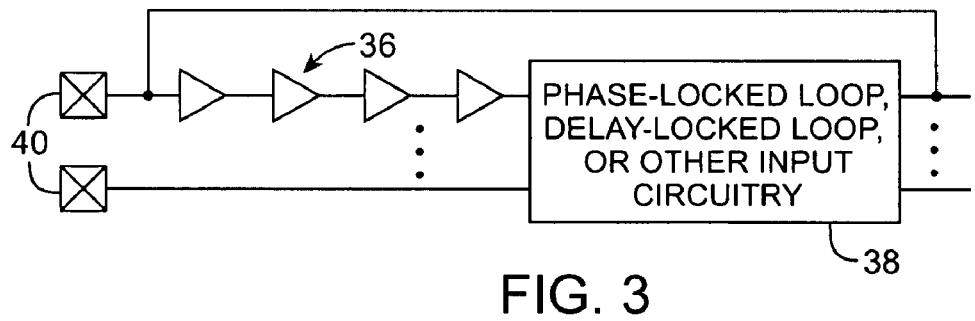
FIG. 3 is a circuit diagram showing how a delay chain may be used with phase-locked loop or delay-locked loop circuitry or input or output circuitry in accordance with the present invention.

FIG. 3 illustrates how a delay chain circuit 36 may be used as part of a phase-locked-loop or delay-locked loop or other input circuit coupled to the input pins 40 of integrated circuit 10. The delay chain 36 may have a fixed amount of delay (as shown in FIG. 3) or may have a programmable amount of delay (e.g., using an arrangement of the type shown in FIG. 2). Some of pins 40 may be connected directly to input circuitry 38. Other pins (such as the upper pin in FIG. 3) may supply signals to circuitry 38 via delay chain 36.

Figure 4:
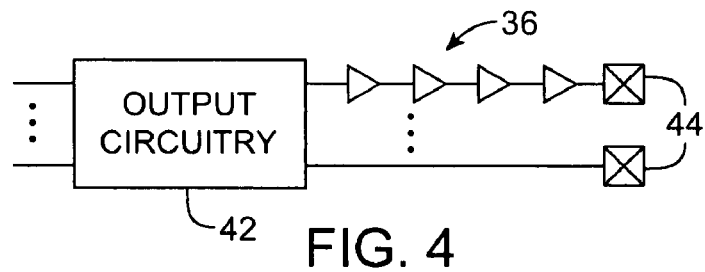
FIG. 4 is a circuit diagram of an illustrative output circuit with a delay chain in accordance with the present invention.
Figure 5:
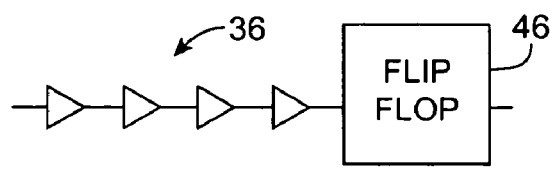
FIG. 5 is a circuit diagram of an illustrative flip-flop circuit with a delay chain in accordance with the present invention.

A programmable or fixed delay chain circuit 36 may also be connected between output circuitry 42 or other circuitry on integrated circuit 10 and output pins such as output pin 42, as shown in FIG. 4. If desired, a programmable or fixed delay chain circuit 36 may be connected to the clock or data input of a flip flop 46, as shown in FIG. 5.

The circuitry of FIGS. 2–5 is merely illustrative. Delay chain circuits in accordance with the present invention may be used in any suitable integrated circuit if desired.

Figure 6:
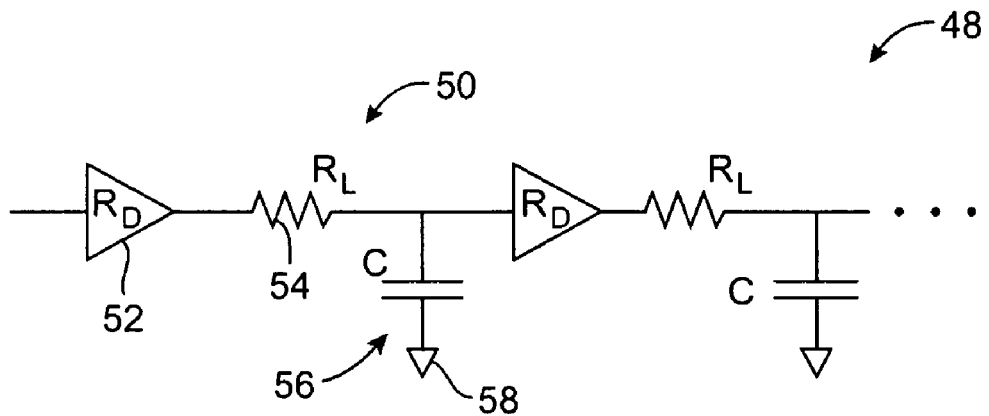
FIG. 6 is a circuit diagram of a conventional programmable logic device delay chain.
Figure 7:
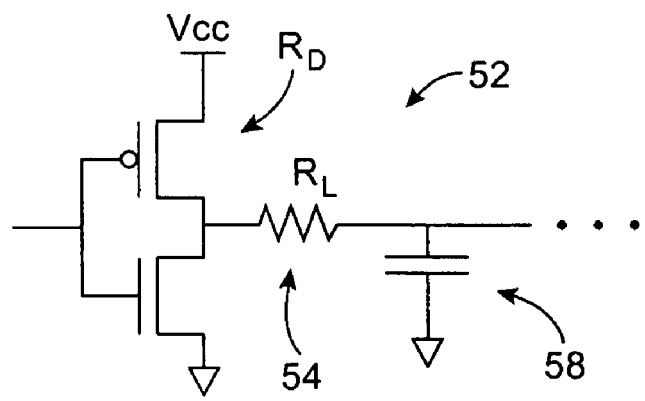
FIG. 7 is a circuit diagram of a conventional programmable logic device delay chain stage.

As shown in FIG. 6, a conventional programmable logic device delay chain circuit 48 has a number of inverter stages 50 each of which has a delay chain inverter 52 with an internal resistance $R_D$, a series-connected load resistor 54 with a resistance $R_L$, and a capacitor 56 connected to a source of ground potential 58 (e.g., connected to a ground Vss of 0 V). The internal resistance $R_D$ is associated with the on resistance of the transistors used in inverter 52. A circuit diagram of a conventional inverter 52 showing how the value of $R_D$ is associated with its metal-oxide-semiconductor transistors is shown in FIG. 7.

The delay of each stage 50 scales with its RC delay time. The RC delay time associated with each stage 50 is given by the capacitance C of capacitor 56 multiplied by the combined resistance of the inverter 52 and the load resistance of resistor 54 (i.e., the total resistance $R_D+R_L$). In conventional programmable logic device circuits the value of the capacitance C is process dependent, $R_D$ is uncontrolled, and $R_L$ varies with operating temperature. These effects make conventional circuits such as circuit 48 of FIG. 6 inaccurate.

Figure 8:
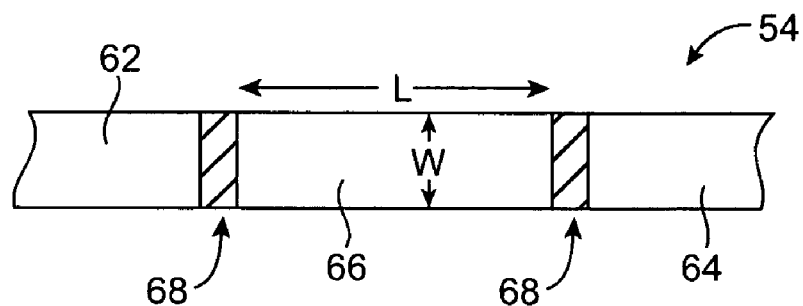
FIG. 8 is a top view of an illustrative resistor in accordance with the present invention.

A top view of an illustrative load resistor 54 is shown in FIG. 8. Resistor 54 has conductive contacts or terminals 62 and 64, which overlap resistor body 66 in regions 68. The body 66 of resistor 54 is formed from a suitable resistive structure. Any suitable resistive structure may be used. Two illustrative examples of suitable load resistor structures are shown in the cross-sectional side views of FIGS. 9 and 10.

Figure 9:
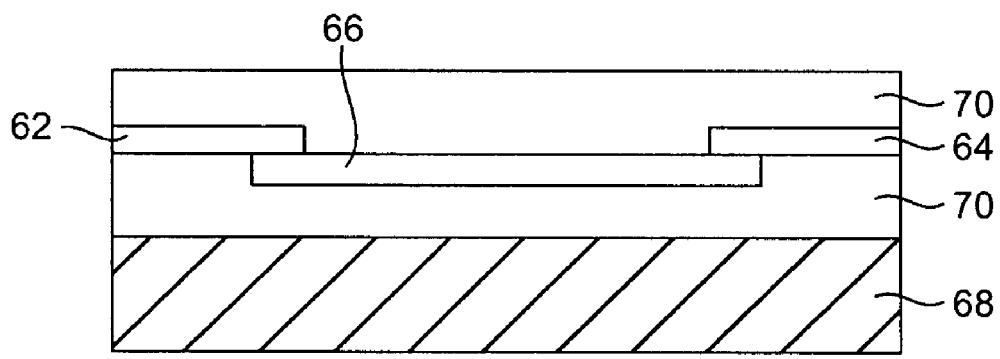
FIG. 9 is a cross-sectional side view of an illustrative polysilicon resistor in accordance with the present invention.

In the example of FIG. 9, load resistor 54 has metal contacts 62 and 64 connected to a polysilicon film 66. The polysilicon film 66 is electrically isolated from substrate 68 and other structures by dielectric 70.

Figure 10:
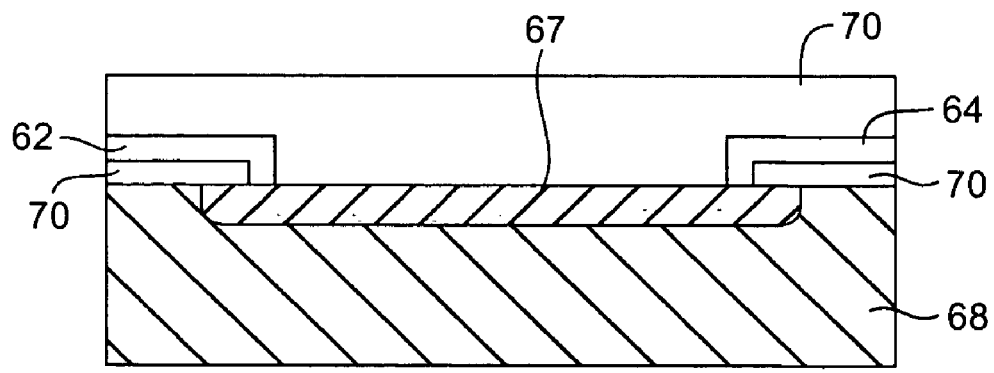
FIG. 10 is a cross-sectional side view of an illustrative diffused resistor in accordance with the present invention.

In the example of FIG. 10, load resistor 54 is formed from a diffused region 67 in substrate 68. Metal contacts 62 and 64 are separated from substrate 68 and other structures by dielectric 70.

The resistance of load resistor structures of the types shown in FIGS. 9 and 10 is temperature dependent, which can adversely affect delay chain performance in conventional, uncompensated circuits.

Figure 11:
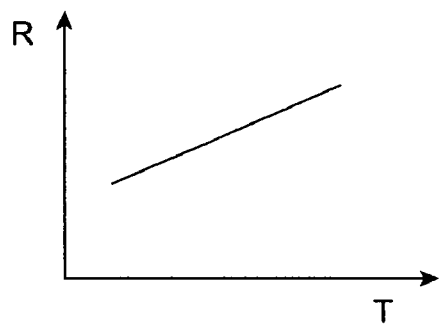
FIG. 11 is a graph showing how conventional delay chains have resistances between stages that vary as a function of temperature.

The temperature dependence of the load resistors in conventional delay chain circuits is shown in the graph of FIG. 11. As the operating temperature of such conventional load resistors increases, their load resistance also increases.

Figure 12:
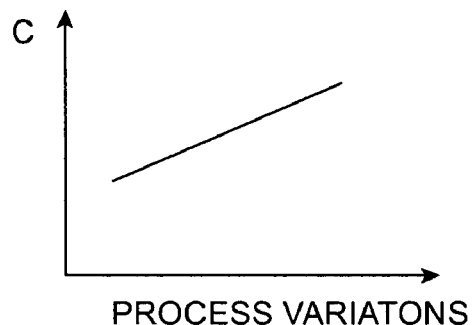
FIG. 12 is a graph showing how process variations can cause the capacitance of conventional delay chain capacitors to vary with process variations.

Conventional capacitors 56 (FIG. 6) for programmable logic device delay chains are formed using the gate oxide layer used in metal-oxide-semiconductor (MOS) transistor structures. The gate oxide layer is extremely thin, so even small process-induced variations in thickness contribute significantly to variations in capacitance. As shown in FIG. 12, the capacitance C of a conventional capacitor 56 varies with process variations such as gate oxide thickness.

Figure 13:
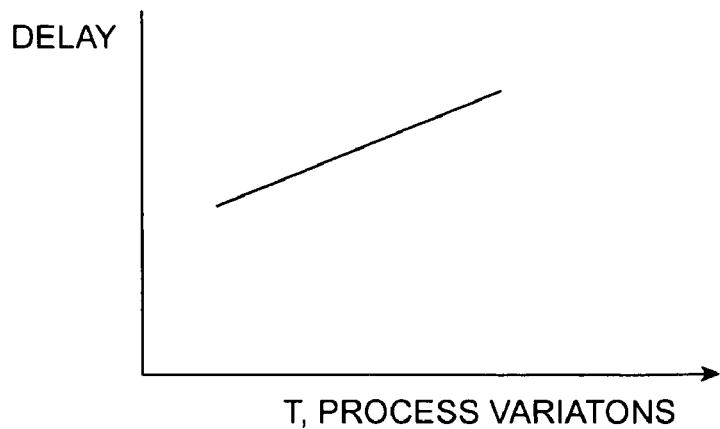
FIG. 13 is a graph showing how delay times for conventional delay chains vary as a function of temperature and process conditions.

Due to the temperature-dependent variation in load resistance (FIG. 11) and the process-dependent variation in capacitance C, the delay of each stage of a conventional delay chain (and therefore the delay of the entire delay chain) varies with temperature and process variations, as shown in FIG. 13.

Figure 14:
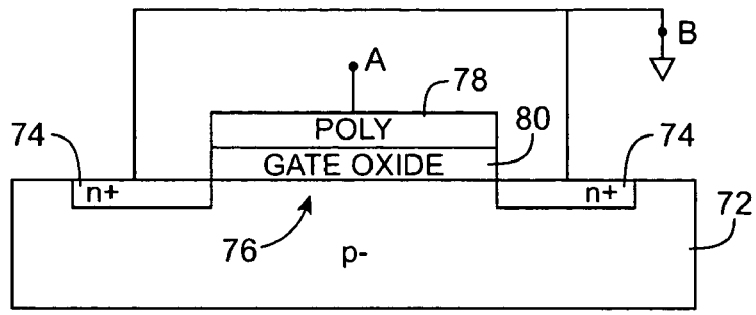
FIG. 14 is a cross-sectional side view of a conventional gate-oxide delay chain capacitor.

A cross-sectional view of a conventional capacitor 56 is shown in FIG. 14. The capacitor is formed on a semiconductor substrate (silicon) 72. Highly-doped regions 74, which are electrically connected to channel region 76 are used to form one electrode of the capacitor. The other electrode of the capacitor is formed by polysilicon region 78. The capacitor electrodes are separated by a gate oxide layer 80. As described in connection with FIGS. 12 and 13, the thickness of the gate oxide layer tends to vary from device to device due to unavoidable variations introduced by the semiconductor manufacturing process. Because the thickness of gate oxide layer 80 is small, these variations can result in considerable variability in the capacitance of conventional capacitors 56 on different integrated circuits. This process-induced variability in capacitance reduces the predictability and accuracy of conventional delay chains.

Figure 15:
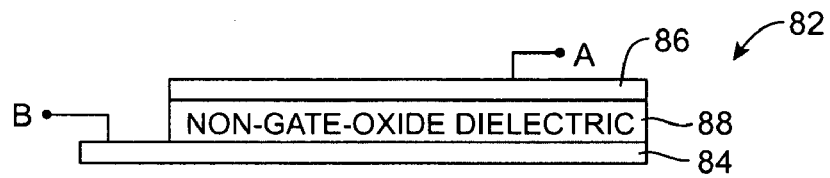
FIG. 15 is a cross-sectional side view of an illustrative non-gate-oxide delay chain capacitor in accordance with the present invention.

In accordance with the present invention, delay chain capacitors can be formed without using a gate oxide layer. An illustrative non-gate-oxide-layer capacitor 82 is shown in FIG. 15. Capacitor 82 has electrodes 84 and 86 that are separated by a non-gate-oxide dielectric layer 88. Dielectric layer 88 may be, for example, an oxide, a nitride, a combination of oxides and nitrides, a polymer, or any other suitable insulator. The thickness of a typical gate oxide is about 20 nm or less. Dielectric layer 88 is preferably at least 10× thicker than this (i.e., 200 nm or more), so that the impact of process-induced thickness variations is reduced by at least 10×.

The structure of FIG. 15 may use metal or other suitable conductors for electrodes 84 and 86. As an example, electrodes 84 and 86 may be formed from the first and second levels of metal on device 10 (sometimes referred to as M1 and M2). Capacitor structures such as the structure of capacitor 82 may be referred to as "metal capacitor structures."

Figure 16:
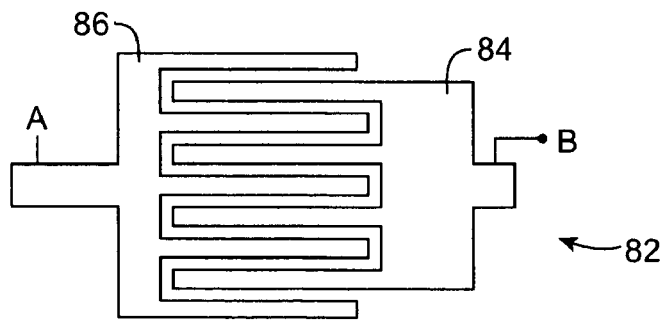
FIG. 16 is a top view of an illustrative non-gate-oxide delay chain capacitor with interdigitated fingers in accordance with the present invention.

Another way in which to eliminate the gate oxide from the capacitor is shown in FIG. 16. With the capacitor 82 that is shown in FIG. 16, the electrodes 84 and 86 are separated horizontally. As shown in the top view of FIG. 16, electrodes 84 and 86 may be formed from interdigitated fingers to increase the overall capacitance of the structure. The fingers of electrodes 84 and 86 may be formed from the same conductive layer (e.g., metal layer M1, metal layer M2, etc.). A dielectric layer separates the fingers.

Figure 17:
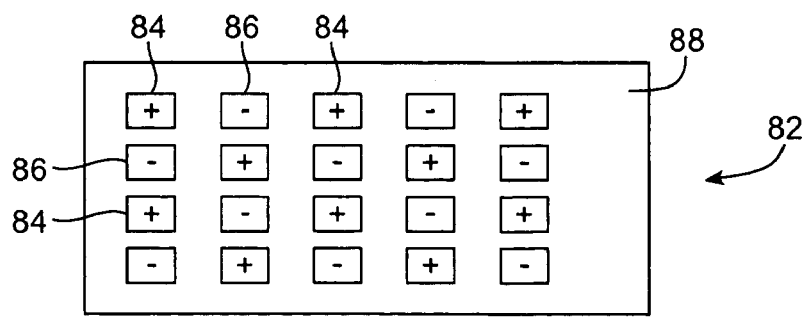
FIG. 17 is a cross-sectional side view of an illustrative non-gate-oxide delay chain capacitor having vertically and horizontally interdigitated fingers in accordance with the present invention.

A hybrid approach is shown in FIG. 17. With the capacitor structure shown in the cross-sectional view of FIG. 17, capacitor electrode fingers 84 and 86 are separated by dielectric 70 in both the horizontal dimension and vertical dimension. The dielectric used in the arrangements of FIGS. 16 and 17 is preferably not a gate oxide layer, to help avoid process-induced variations and thereby improve the accuracy of each delay chain stage.

In accordance with the present invention, the impact of variations in the resistance of the load resistor due to changes in operating temperature can be reduced or eliminated by using compensation circuitry to adjust the internal resistance of the delay chain buffers. In particular, the temperature of the device 10 can be measured in real time. As the temperature increases, the load resistance $R_L$ increases (FIG. 11). The internal resistance of the delay chain buffer can therefore be decreased accordingly, to maintain a constant, temperature-independent series resistance.

Figure 18:
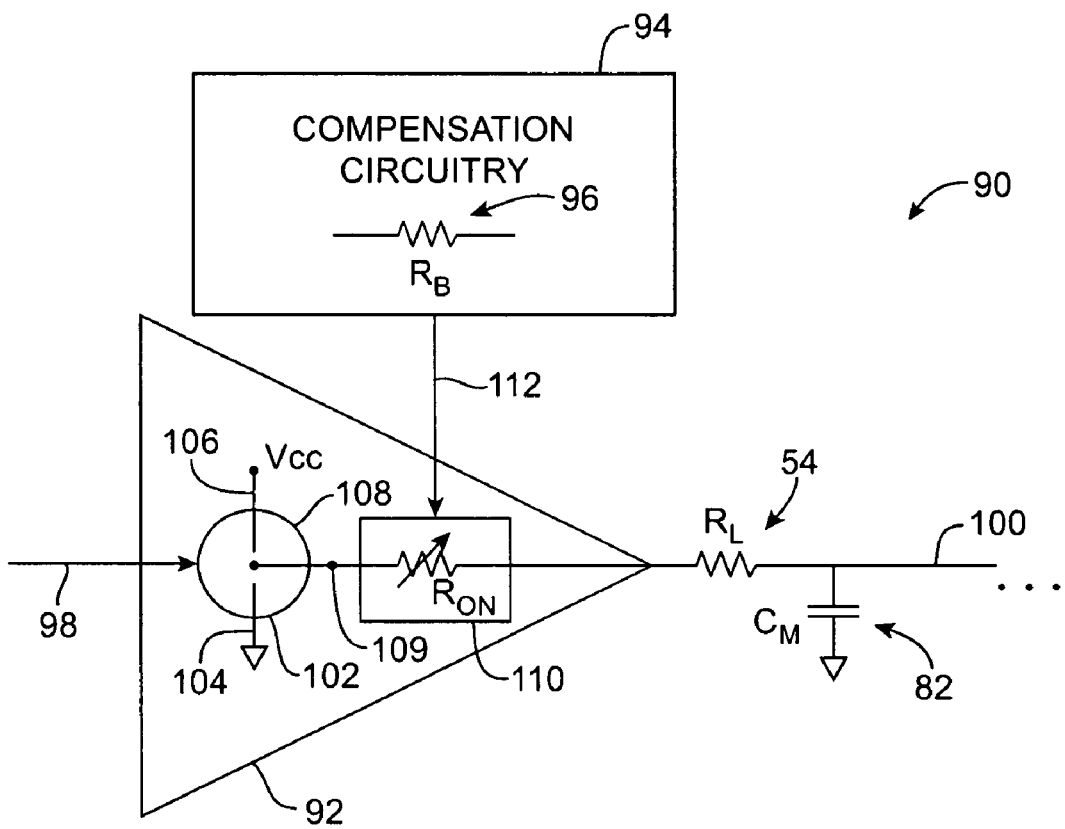
FIG. 18 is a schematic circuit diagram of an illustrative delay chain stage and compensating circuitry in accordance with the present invention.

An illustrative delay chain stage 90 is shown in FIG. 18. Delay chain stage 90 has a buffer circuit 92 (e.g., an inverter). An input signal from an earlier stage in the delay chain is received at input 98. A corresponding output signal is inverted by inverter 92, passed through load resistance 54, and provided to the next stage in the delay chain via output 100.

Capacitor 82 is preferably formed from a non-gate-oxide structure to increase accuracy, as described in connection with FIGS. 15–17, but may be formed from other structures or a conventional gate oxide structure if desired.

Inverter 92 contains circuitry that performs the functions of an input-controlled switch, shown schematically by switch 108. When the input signal at input 98 is high (e.g., a logic one), switch 108 connects node 109 to ground terminal 104. When the input signal at input 98 is low (e.g., a logic zero), switch 108 connects node 109 to positive power supply terminal 106.

Figure 19:
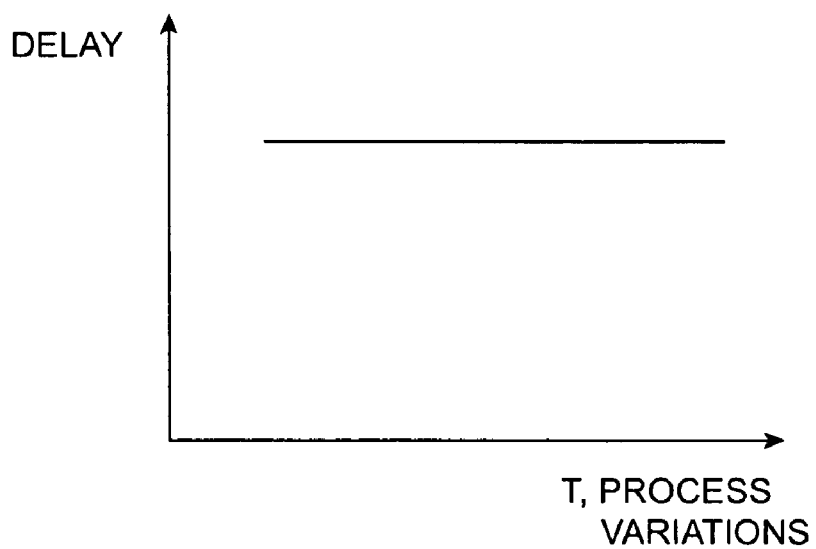
FIG. 19 is a graph showing how the delay associated with the delay chain of the present invention is substantially independent of temperature and process variations.

The inverter 92 has an associated internal resistance 110 ($R_{ON}$). The resistance $R_{ON}$ results from internal transistor circuitry in inverter 92 that is used to perform the switching operations represented schematically by switch circuitry 108. This internal resistance is controlled by compensation circuitry 94, so as to cancel out impact of the temperature-induced variations in $R_L$ on the overall performance of stage 90. When the resistance of $R_L$ goes up due to an increase in operating temperature, compensation circuitry 94 detects this change (e.g., by measuring the resistance $R_B$ of an internal resistor 96) and issues temperature-compensation control signals on path 112. The compensating control signals lower the resistance of resistor 110, so that the total resistance $R=R_{ON}+R_L$ remains unchanged despite changes in operating temperature. By making the capacitance $C_M$ essentially independent of variations due to process changes (e.g., by forming capacitor 82 using a process-tolerance structure such as one of the structures of FIGS. 15–17), the RC delay time associated with stage 90 is held constant with respect to variations in operating temperature and process conditions, as shown in FIG. 19.

Figure 20:
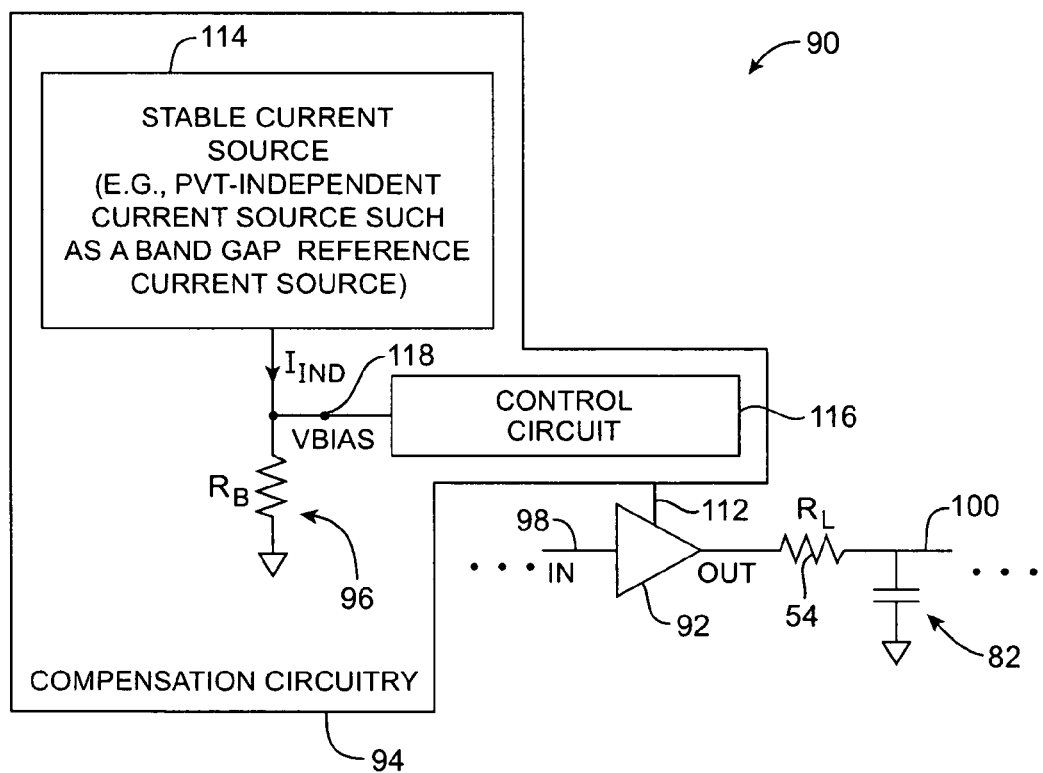
FIG. 20 is a circuit diagram of an illustrative stabilized delay chain stage that uses a stable current source such as a band gap reference current source as part of its compensation circuitry in accordance with the present invention.

Any suitable circuitry may be used to compensate stage 90 for temperature effects. An illustrative compensation circuit arrangement for stage 90 is shown in FIG. 20. With the arrangement of FIG. 20, compensation circuitry 94 uses sensing resistor 96 to sense changes in temperature. Resistor 96 is preferably fabricated using the same type of structure that is used to fabricate load resistor 54. For example, if load resistor 54 is formed using a polysilicon structure of the type shown in FIG. 9, resistor 96 is preferably formed using the same type of structure (or at least a structure having a temperature-dependent resistance that tracks that of the structure of FIG. 9). Similarly, if the load resistor 54 is formed using diffused resistor structure of the type shown in FIG. 10, resistor 96 is preferably either a diffused resistor or is formed using a structure having a temperature dependence that is proportional to the temperature dependence of the diffused load resistor 54.

A stable current source such as a process-voltage-temperature-independent (PVT-independent) current source is used to apply a current $I_{IND}$ to resistor 96. Any suitable current source may be used for current source 114. One suitable stable current source that may be used is a bandgap reference current source. An advantage of using a stable current source such as a bandgap reference current source for current source 114, is that its performance will be relatively independent of changes in temperature and supply voltage and process-induced changes.

The current $I_{IND}$ that is applied to resistor 96 produces a voltage VBIAS at node 118. Control circuitry 116 receives VBIAS as an input and generates corresponding control signals. These control signals are applied to inverter 92 via path 112 to adjust its internal resistance $R_{ON}$ to compensate for temperature-induced changes in the resistance of $R_L$, as described in connection with FIGS. 18 and 19.

Figure 21:
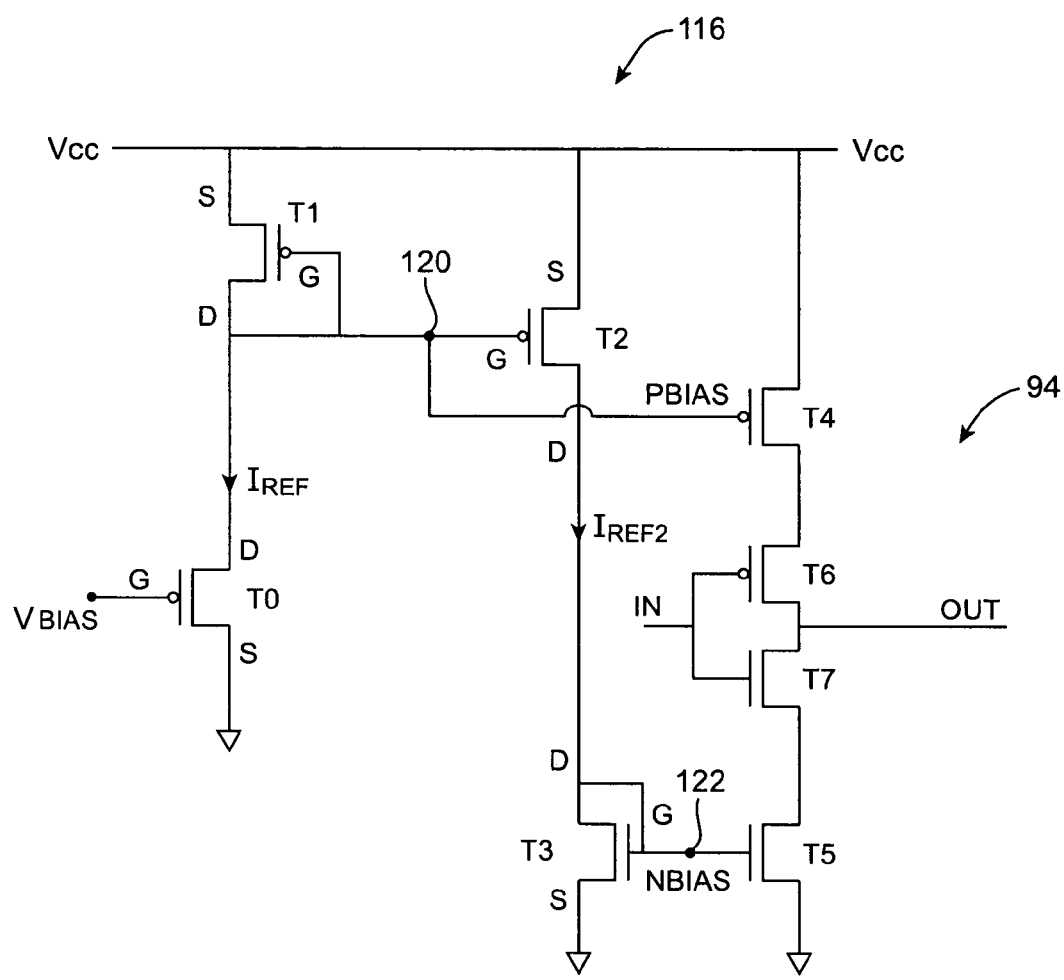
FIG. 21 is a diagram of illustrative stabilized delay chain circuitry in accordance with the present invention.

Any suitable control circuit arrangement may be used for control circuitry 116. An illustrative circuit arrangement is shown in FIG. 21. In the example of FIG. 21, control circuitry 116 has a transistor T0 that converts the bias voltage input VBIAS to a current $I_{REF}$. Transistors T1 and T2 form a current mirror, so the current $I_{REF2}$ mirrors that of $I_{REF}$.

When, for example, VBIAS increases due to an increase of operating temperature and a corresponding increase in the resistance $R_B$ of the sensing resistor 96 in compensation circuitry 94, the current $I_{REF}$ increases as transistor T0 is turned on by its increasing gate voltage. The increase in $I_{REF}$ causes an increase in the magnitude of the source-gate voltage of transistor T1. The voltage at node 120 (i.e., the compensation control signal PBIAS) drops accordingly. When the voltage at node 120 drops, the magnitude of the source-gate voltage across transistor T2 increases (tracking the source-gate voltage across transistor T1). This change in the source-gate voltage across transistor T2 causes the current $I_{REF2}$ to increase by the same amount as $I_{REF}$ (i.e., $I_{REF2}=I_{REF}$). The current $I_{REF2}$ flows through transistor T3 as the drain-source current of transistor T3. The gate of transistor T3 is tied to node 122. As $I_{REF2}$ increases, the source-gate voltage of transistor T3 and therefore the voltage at node 122 increase. The voltage at node 122 serves as the compensation control signal NBIAS.

When VBIAS decreases due to a decrease in the operating temperature and therefore a decrease in the resistance $R_B$ of sensing resistor 96 (FIG. 20), the current $I_{REF}$ decreases. This causes the voltage at node 120 to rise and the voltage at node 122 to fall.

Figure 22:
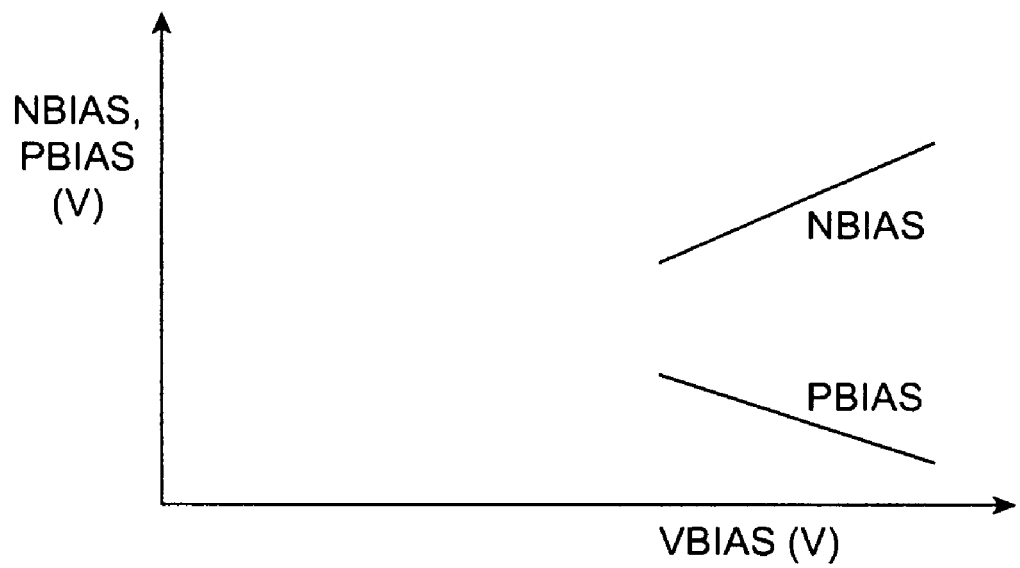
FIG. 22 is a graph showing how the delay chain stabilization control signals NBIAS and PBIAS that are associated with the illustrative stabilized delay chain circuitry of FIG.

The behavior of the compensation control signals PBIAS and NBIAS as a function of VBIAS is shown in FIG. 22. Because the resistor 96 is preferably formed using the same type of structure as the load resistor $R_L$, the resistance $R_B$ of resistor 96 serves as an accurate indicator of the temperature-induced resistance changes in the resistance $R_L$ of load resistor 54. When the resistance of the load resistor 54 changes due to fluctuations in the operating temperature of device 10, the resistance of resistor 96 changes by a corresponding amount. The change in the resistance of resistor 96 is converted to a change in VBIAS by circuitry 94 (FIG. 20). This, in turn, is converted to changes in the compensation control signals PBIAS and NBIAS as shown in FIG. 22.

As shown in FIG. 21, the signal PBIAS is applied to the gate of transistor T4. The signal NBIAS is applied to the gate of transistor T5. When the voltage VBIAS increases, NBIAS rises and PBIAS falls, which tends to turn on transistors T4 and T5 and cause their source-drain resistances to drop. When the voltage VBIAS decreases, the source-drain resistances of transistors T4 and T5 increase. Transistors T4 and T5 serve as a resistance-adjusting portion of inverter 94. Increases and decreases in the source-drain resistances of transistors T4 and T5 cause corresponding increases and decreases in the internal resistance of inverter 94 (formed from the series connection of transistors T4, T6, T7, and T5). The arrangement of FIG. 21 therefore allows changes in the internal resistance $R_{ON}$ (the "on resistance") of inverter 94 to be controlled by the voltage VBIAS.

The illustrative delay chain buffer circuit of FIG. 21 is formed from an inverter having a main inverter portion formed from p-channel metal-oxide-semiconductor (PMOS) transistor T6 and n-channel metal-oxide-semiconductor (NMOS) transistor T7 and having resistance-adjusting PMOS transistor T4 and resistance-adjusting NMOS transistor T5. This arrangement is merely illustrative. Any suitable delay chain buffer circuitry that is responsive to operating temperature compensation control signals may be used for the buffers in the delay chain if desired.

An increase in operating temperature increase the resistance $R_L$ of load resistor 54, as shown in FIG. 23. The resistance of temperature sensing resistor 96 changes by a corresponding amount, because resistor 96 and 54 are formed using the same type of structure (or using structures whose temperature-dependent resistances behave similarly). The stable current source 114 applies a current to the resistor 96 that converts the increasing resistance $R_B$ into an increasing voltage VBIAS. The increased voltage VBIAS is translated into an increase in NBIAS and a decrease in PBIAS, as shown in FIG. 22. These control signals turn on transistors T4 and T5 more strongly, thereby reducing the internal resistance RON of inverter 92. As shown in FIG. 23, the reduction of $R_{ON}$ with increasing temperature cancels out the increase in $R_L$, so that the combined series resistance $R=R_{ON}+R_L$ is constant, even as the temperature T increases. Similarly, when $R_L$ decreases due to a decrease in operating temperature, VBIAS falls by a corresponding amount, so that transistors T4 and T5 are turned off and the resistance $R_{ON}$ increases sufficiently to maintain R at a constant level. The compensation circuitry 94 is therefore able to maintain R at a constant level, independent of temperature variations.

When a stable capacitor structure such as a structure of the type shown in FIGS. 15–17 is used, the value of C is relatively independent of process variations. Using a process-independent capacitor C with a temperature-compensated inverter, the RC delay of delay chain stage 90 is maintained at an accurate constant value, independent of temperature and process variations.

An illustrative distribution arrangement that may be used to distribute temperature-compensation control signals such as the NBIAS and PBIAS signals is shown in FIG. 24. Compensation circuitry 94 may be placed in one or more locations on an integrated circuit 10. In general, area may be saved by creating one or only a few copies of compensation circuitry 94.

The compensation control signals are often needed to compensate delay chain circuits used within I/O circuitry on a device. Such I/O circuitry is typically distributed in an I/O ring 126 around the periphery of the device, as shown in FIG. 24. The compensation control signals are relatively low-current signals, so there are relatively few ohmic losses associated with distributing these signals over fairly long distances on device 10. The conductive lines used to distribute the signals may also be small in size due to the low current requirements for these signals. The compensation circuitry 94 may located in the I/O ring 126 or in core logic 134 (as an example). Core logic 134 may contain any suitable circuitry (e.g., digital circuits such as programmable logic 18 and interconnection resources 16 controlled by programmable elements 20 on a programmable logic device, as shown in FIG. 1).

As shown in the illustrative distribution arrangement of FIG. 24, the compensation control signals can be distributed to I/O circuitry in the I/O ring 126 as part of the bus structures 124 in the I/O ring. The conductive lines of these buses may also be used to distribute power supply voltages (e.g., a voltage Vccio and a ground voltage Vss) to the I/O ring circuitry. Taps 128 may be provided at various locations (e.g., at each input and/or output circuit with a delay chain to be compensated). At each of the taps 128, the compensation control signals (e.g., the NBIAS and PBIAS signals) are applied to the gates 130 of transistors 132 in a respective inverter 92, to adjust internal resistance, as described in connection with FIG. 18. In the illustrative example of FIG. 25, an NBIAS control signal is shown as being distributed to taps 128 via bus 124.

The foregoing is merely illustrative of the principles of this invention and various modifications can be made by those skilled in the art without departing from the scope and spirit of the invention.

What is claimed is:

1. A digital integrated circuit that operates at an operating temperature, comprising:
   temperature compensation circuitry that generates temperature-compensation control signals that depend on the operating temperature; and
   a delay chain circuit having a plurality of series-connected buffers and an associated total delay time, each buffer having an internal resistance that is adjusted by the temperature-compensation control signals from the temperature compensation circuitry to reduce dependence of the total delay time on temperature, wherein the delay chain buffers are connected in series with respective load resistors, wherein the delay chain further comprises a plurality of capacitors, each capacitor having a first electrode connected to ground and a second electrode connected to an input of a respective delay chain buffer, and wherein the first and second electrodes are separated by a non-gate-oxide dielectric, wherein the temperature compensation circuitry comprises:
a bandgap reference current source that produces a current; and
a resistor to which the current is applied.

2. The digital integrated circuit defined in claim 1 wherein the delay chain circuit comprises a plurality of inverters, each having an on resistance that is adjusted by the temperature-compensation control signals.

3. The digital integrated circuit defined in claim 1 wherein the delay chain is a programmable delay chain, and wherein the integrated circuit comprises a programmable logic device, the digital integrated circuit comprising programmable elements producing static control signals that adjust the programmable delay chain.

4. A digital integrated circuit that operates at an operating temperature, comprising:
temperature compensation circuitry that generates temperature-compensation control signals that depend on the operating temperature; and
a delay chain circuit having a plurality of series-connected buffers and an associated total delay time, each buffer having an internal resistance that is adjusted by the temperature-compensation control signals from the temperature compensation circuitry to reduce dependence of the total delay time on temperature, wherein the buffers in the delay chain are connected in series with respective load resistors and wherein the temperature compensation circuitry comprises a sensing resistor whose resistance changes with temperature are used by the temperature compensation circuitry to detect the operating temperature, wherein the load resistors and sensing resistor are polysilicon resistors, and wherein the temperature compensation circuitry comprises a bandgap reference current source that produces a current that is applied to the sensing resistor.

5. A digital integrated circuit that operates at an operating temperature, comprising:
temperature compensation circuitry that generates temperature-compensation control signals that depend on the operating temperature; and
a delay chain circuit having a plurality of series-connected buffers and an associated total delay time, each buffer having an internal resistance that is adjusted by the temperature-compensation control signals from the temperature compensation circuitry to reduce dependence of the total delay time on temperature, wherein the buffers in the delay chain are connected in series with respective load resistors and wherein the temperature compensation circuitry comprises a sensing resistor whose resistance changes with temperature are used by the temperature compensation circuitry to detect the operating temperature, wherein the load resistors and sensing resistor are diffused resistors, and wherein the temperature compensation circuitry comprises a bandgap reference current source that produces a current that is applied to the sensing resistor.

6. The digital integrated circuit defined in claim 1 wherein the delay chain buffers comprise inverters each having a main inverter portion and two resistance-adjusting transistors having gates that receive the temperature-compensation control signals.

7. The digital integrated circuit defined in claim 1 wherein the delay chain buffers comprise inverters each having a main inverter portion formed from a p-channel metal-oxide-semiconductor transistor and an n-channel metal-oxide-semiconductor transistor and each having a resistance-adjusting p-channel metal-oxide-semiconductor transistor connected between a positive voltage terminal and the p-channel metal-oxide semiconductor transistor in the main inverter portion and each having a resistance-adjusting n-channel metal-oxide-semiconductor transistor connected between a ground voltage terminal and the n-channel metal-oxide-semiconductor transistor in the main inverter portion, and wherein the resistance-adjusting p-channel metal-oxide-semiconductor transistor and the resistance-adjusting n-channel metal-oxide-semiconductor transistors each have gates that receive the temperature-compensation control signals from the compensation circuitry.

8. The digital integrated circuit defined in claim 1 wherein the buffers in the delay chain are connected in series with respective load resistors each having a load resistance, wherein the internal resistance of each buffer summed with the load resistance of that buffer's respective load resistance forms a total stage resistance, and wherein the temperature compensation circuitry adjusts the internal resistances of the buffers so that the total stage resistances are maintained constant as the operating temperature varies.

9. A programmable logic device that operates at an operating temperature, comprising:
programmable elements that produce static control signals;
programmable logic controlled by at least some of the static control signals;
at least one delay chain circuit comprising a plurality of inverters and load resistors connected in series and comprising a plurality of capacitors, each capacitor having a first electrode connected to an input of a respective one of the plurality of inverters and a second electrode connected to ground, wherein the delay chain circuit has an associated delay time; and
temperature compensation circuitry that produces temperature-compensation control signals that depend on the operating temperature, wherein the temperature-compensation control signals are applied to the inverters to make the delay of the delay chain independent of variations in the operating temperature, wherein the temperature-compensation circuit comprises a bandgap current source that applies a current to a sensing resistor to produce a signal indicative of the operating temperature.

10. The programmable logic device defined in claim 9 wherein each inverter has an associated on resistance and wherein the on resistance of each inverter summed with a respective one of the load resistors equals a total stage resistance, the temperature compensation circuitry producing temperature-compensation control signals that maintain each total stage resistance at a constant value as the operating temperature varies.

11. The programmable logic device defined in claim 9 wherein the first and second electrodes of each capacitor are separated by a non-gate-oxide dielectric.

12. The programmable logic device defined in claim 9 further comprising:
   a programmable bypass circuit that bypasses a number of the delay chain inverters in response to the static control signals.

13. The programmable logic device defined in claim 9 wherein the at least one delay chain circuit comprises a plurality of the delay chain circuits, the programmable logic device further comprising an input-output ring of input-output circuitry and a conductive path in the input-output ring that distributes the temperature-compensation control signals from the temperature-compensation circuitry to each of the plurality of delay chain circuits.

* * * * *